(12) United States Patent
Ishikawa et al.

(10) Patent No.: US 8,629,687 B2
(45) Date of Patent: Jan. 14, 2014

(54) DISCONNECTION DETECTING DEVICE

(75) Inventors: Satoshi Ishikawa, Makinohara (JP);
Kimihiro Matsuura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 936 days.

(21) Appl. No.: 12/662,568

(22) Filed: Apr. 23, 2010

(65) Prior Publication Data
US 2010/0271052 A1 Oct. 28, 2010

(30) Foreign Application Priority Data

Apr. 24, 2009 (JP) ................................ 2009-106104
Jun. 24, 2009 (JP) ................................ 2009-149767

(51) Int. Cl.
*G01R 27/26* (2006.01)

(52) U.S. Cl.
USPC ........... 324/686; 324/433; 324/434; 324/426; 320/134; 320/136

(58) Field of Classification Search
USPC ........... 324/426, 433, 434, 686; 320/134, 136
See application file for complete search history.

(56) References Cited

U.S. PATENT DOCUMENTS 5,825,155 A * 10/1998 Ito et al. .................... 320/118
6,268,710 B1 * 7/2001 Koga ......................... 320/116

FOREIGN PATENT DOCUMENTS

JP 3839397 8/2006

* cited by examiner

*Primary Examiner* — Arleen M Vazquez
(74) *Attorney, Agent, or Firm* — Edwards Wildman Palmer LLP

(57) ABSTRACT

A control circuit turns on a switching element to discharge a capacitor, and after a voltage between both ends of the capacitor becomes zero, the control circuit turns off the switching element. The control circuit measures the voltage V1, V2 between both ends of the capacitor after the first predetermined time is passed and after the second predetermined time is passed, and calculate a change rate (V1/V2). If V1/V2 is equal to or less than 0.5, the disconnection is detected.

13 Claims, 10 Drawing Sheets

DISCONNECTION DETECTING DEVICE

CROSS REFERENCE TO RELATED APPLICATIONS

This application is on the basis of Japanese Patent Applications No. 2009-106104 and No. 2009-149767, the contents of which are hereby incorporated by reference.

BACKGROUND OF THE INVENTION

1. Field of the Invention

The present invention relates to a disconnection detecting device, in particular, a disconnection device to detect a disconnection of electric paths connecting each both ends of a plurality of series-connected unit cells with a voltage measuring device for measuring a voltage between both ends of the unit cells.

2. Description of the Related Art

Recently, a hybrid vehicle (hereinafter referred to as "HEV") running with an engine and an electric motor in combination has become widely used. This HEV includes a low-voltage battery about 12 V for starting the engine, and a high voltage battery for driving the electric motor. This high voltage battery is made of series-connected unit cells. The unit cell is a secondary battery such as nickel hydride battery or lithium battery.

After repeating charge and discharge cycles of the high voltage battery, a voltage across each unit cell, namely, a state of charge (SOC) is varied. With regard to the charge and discharge of the battery, in view of endurance of the battery and safety ensuring, when the unit cell having the highest SOC (or a voltage between both ends) reaches an upper limit, the charge is stopped, and when the unit cell having the lowest SOC (or a voltage between both ends) reaches a lower limit, the discharge is stopped. Accordingly, when the SOCs of the unit cells are varied, an enabled capacity of the battery is substantially reduced. Therefore, in the HEV, so called assistance and regeneration of the battery become insufficient, and a moving performance and mileage are reduced. Consequently, for equalizing the SOCs of the unit cells, the voltages across the unit cells should be measured.

Conventionally, both ends of each unit cell are connected to a voltage measuring IC as a voltage measuring device, and the voltage measuring IC measures the voltage between both ends of each unit cell. However, when an electric path connecting the unit cells with the voltage measuring IC is disconnected, voltage potential at the electric path side which is disconnected is unstable due to an influence of an internal impedance of the voltage measuring IC. Therefore, there is a problem that the voltage between both ends of the unit cell cannot be correctly measured.

So, a disconnection detecting device to detect the disconnection when a voltage difference between the voltage between both ends of the unit cell when a bypass resistor is turned on and the voltage between both ends of the unit cell when the bypass resistor is turned off is large, where a bypass circuit composed of the bypass resistor and a switching device to turn on/off the bypass resistor is connected in parallel to the unit cell is proposed (Patent Document 1).

However, in the above described disconnection detecting device, it is necessary that the bypass resistor is arranged parallel to the unit cell. Therefore, a bypass resistor is needed other than a resistor for a noise filter connected between both ends of the unit cell and the voltage measuring IC, and a discharge resistor for equalizing the unit cell. Therefore, there is a problem that the number of electric components is increased. Further, when the resistance value of any one of the resistor for noise filter and the bypass resistor is varied, the measuring voltage is largely varied. Therefore, there is a problem that the variation of the resistance value causes the false detection.

[Patent Document 1] Japanese Patent No. 3839397

Accordingly, an object of the present invention is to provide a disconnection detecting device for detecting a disconnection of an electric path at a low price.

SUMMARY OF THE INVENTION

In order to attain the object, according to the present invention, there is provided a disconnection detecting device for detecting a disconnection of electric paths connecting each both ends of a plurality of series-connected unit cells with a voltage measuring device for measuring a voltage between both ends of the unit cells, said disconnection detecting device including:

a plurality of resistors respectively provided at the electric paths connecting both ends of each of the unit cells with the voltage measuring device;

a plurality of switching elements connected in parallel to the respective unit cells via the resistors;

a plurality of capacitors connected in parallel to the respective unit cells and the respective switch elements via the resistors;

a switch control devise for firstly turning on the switch element to discharge the capacitor to make a voltage between both ends of the capacitor zero, and then turning off the switching element;

a first capacitor voltage measuring device for measuring a voltage between both ends of the capacitor, firstly after the switch control device turns off the switch element, then, at the time after the voltage between both ends of the capacitor becomes equal to the voltage between both ends of the unit cell when the electric path is normal, and before the voltage between both ends of the capacitor becomes equal to the voltage between both ends of the unit cell when the electric path is disconnected;

a second capacitor voltage measuring device for measuring a voltage between both ends of the capacitor after the first capacitor voltage measuring device measures the voltage; and a disconnection detecting unit for detecting the disconnection of the electric path based on the respective measured voltages between both ends of the capacitor by the first and second capacitor voltage measuring devices.

Preferably, the disconnection detecting device detects the disconnection when (the voltage between both ends of the capacitor measured by the first capacitor voltage measuring device)/(the voltage between both ends of the capacitor measured by the second capacitor voltage measuring device) is equal to or less than a first threshold value, or when (the voltage between both ends of the capacitor measured by the second capacitor voltage measuring device)/(the voltage between both ends of the capacitor measured by the first capacitor voltage measuring device) is equal to or more than a second threshold value.

Preferably, the first capacitor voltage measuring device is so set to measure the voltage between both ends of the capacitor after a first predetermined time is passed from the time that the switch control device turns off the switching element, and the second capacitor voltage measuring device is so set to measure the voltage between both ends of the capacitor after a second predetermined time which is longer than the first predetermined time is passed from the time that the switch control device turns off the switching element, wherein the first predetermined time is set to be longer than 3*(charge time constant of the capacitor when the electric path is normal) and shorter than 0.4*(charge time constant of the capacitor when the electric path is disconnected), and wherein the second predetermined time is set to be longer than (charge time constant of the capacitor when the electric path is disconnected), and wherein the first threshold value is equal to or less than 0.5 or the second threshold value is equal to or more than 2.

According to another aspect of the present invention, there is provided a disconnection detecting device for detecting a disconnection of electric paths connecting each both ends of a plurality of series-connected unit cells with a voltage measuring device for measuring a voltage between both ends of the unit cells, said disconnection detecting device including:

a plurality of resistors respectively provided at the electric paths connecting both ends of each of the unit cells with the voltage measuring device;

a plurality of switching elements connected in parallel to the respective unit cells via the resistors;

a plurality of capacitors connected in parallel to the respective unit cells and the respective switch elements via the resistors;

a switch control devise for firstly turning on the switch element to discharge the capacitor to make a voltage between both ends of the capacitor zero, and then turning off the switching element;

a third capacitor voltage measuring device for measuring a voltage between both ends of the capacitor, firstly after the switch control device turns off the switch element, then, at the time after the voltage between both ends of the capacitor becomes equal to the voltage between both ends of the unit cell when the electric path is normal, and before the voltage between both ends of the capacitor becomes equal to the voltage between both ends of the unit cell when the electric path is disconnected;

a disconnection detecting unit for detecting the disconnection of the electric path when the voltage between both ends of the capacitor measured by the third capacitor voltage measuring device is less than a third threshold value.

Preferably, the third threshold value is set to be less than a minimum voltage between both ends of the unit cell when the unit cell is normal.

Preferably, the third capacitor voltage measuring device is so set to measure the voltage between both ends of the capacitor after a third predetermined time is passed from the time that the switch control device turns off the switching element, wherein the third predetermined time is set to be longer than 3*(charge time constant of the capacitor when the electric path is normal) and shorter than 1*(charge time constant of the capacitor when the electric path is disconnected), and wherein the second predetermined time is set to be longer than 1*(charge time constant of the capacitor when the electric path is disconnected).

According to another aspect of the present invention, there is provided a disconnection detecting device for detecting a disconnection of electric paths connecting each both ends of a plurality of series-connected unit cells with a voltage measuring device for measuring a voltage between both ends of the unit cells, said disconnection detecting device including:

a plurality of resistors respectively provided at the electric paths connecting both ends of each of the unit cells with the voltage measuring device;

a plurality of switching elements connected in parallel to the respective unit cells via the resistors;

a plurality of capacitors connected in parallel to the respective unit cells and the respective switch elements via the resistors;

a first capacitor voltage measuring device for measuring a voltage between both ends of the capacitor before the switching element is turned on;

a switch control devise for firstly turning on the switch element to discharge the capacitor to make a voltage between both ends of the capacitor zero, and then turning off the switching element;

a second capacitor voltage measuring device for measuring the voltage between both ends of the capacitor after the switching element is turned on; and a disconnection detecting unit for detecting the disconnection of the electric path based on the respective measured voltages between both ends of the capacitor by the first and second capacitor voltage measuring devices.

Preferably, the second capacitor voltage measuring device is so set to measure the voltage between both ends of the capacitor after a predetermined time is passed from the time that the switch control device turns off the switching element, wherein the disconnection detecting unit is so set to detect the disconnection of the electric path based on a comparison between the voltage between both ends of the capacitor measured by the second capacitor voltage measuring device, and a threshold value determined corresponding to the voltage between both ends of the capacitor measured by the first capacitor voltage measuring device, and wherein the predetermined time is set between the time when the voltage between both ends of the capacitor becomes constant from zero in a case that the electric path is normal, and the switching element is turned off to charge the capacitor, and the time when the voltage between both ends of the capacitor becomes constant from zero in a case that the electric path is disconnected, and the switching element is turned off to charge the capacitor.

Preferably, the predetermined time is set between the time when the voltage between both ends of the capacitor becomes constant from zero in a case that the electric path is normal, and the switching element is turned off to charge the capacitor, and a charge time constant of the capacitor in a case that the electric path is disconnected.

Preferably, the threshold value is set to be equal to or less than 0.63*(the voltage between both ends of the capacitor measured by the first capacitor voltage measuring device).

Preferably, the predetermined time is set as the time when the voltage between both ends of the capacitor becomes constant from zero in a case that the electric path is normal, and the switching element is turned off to charge the capacitor, which is defined by 3*(charge time constant of the capacitor determined by the resistor and the capacitor in a case that the electric path is normal).

These and other objects, features, and advantages of the present invention will become more apparent upon reading of the following detailed description along with the accompanied drawings.

DETAILED DESCRIPTION OF THE PREFERRED EMBODIMENTS

First Embodiment

Hereinafter, a first embodiment of the present invention will be explained with reference to figures. In this embodiment, a voltage measuring device is mounted on a vehicle. A reference mark $B_L$ in FIG. 1 indicates a low voltage battery. The low voltage battery $B_L$ is used for a driving source of a starter which starts an engine. A high voltage battery as a charger is connected as necessary to both ends of the low voltage battery BL via a DC/DC converter.

Figure 1:
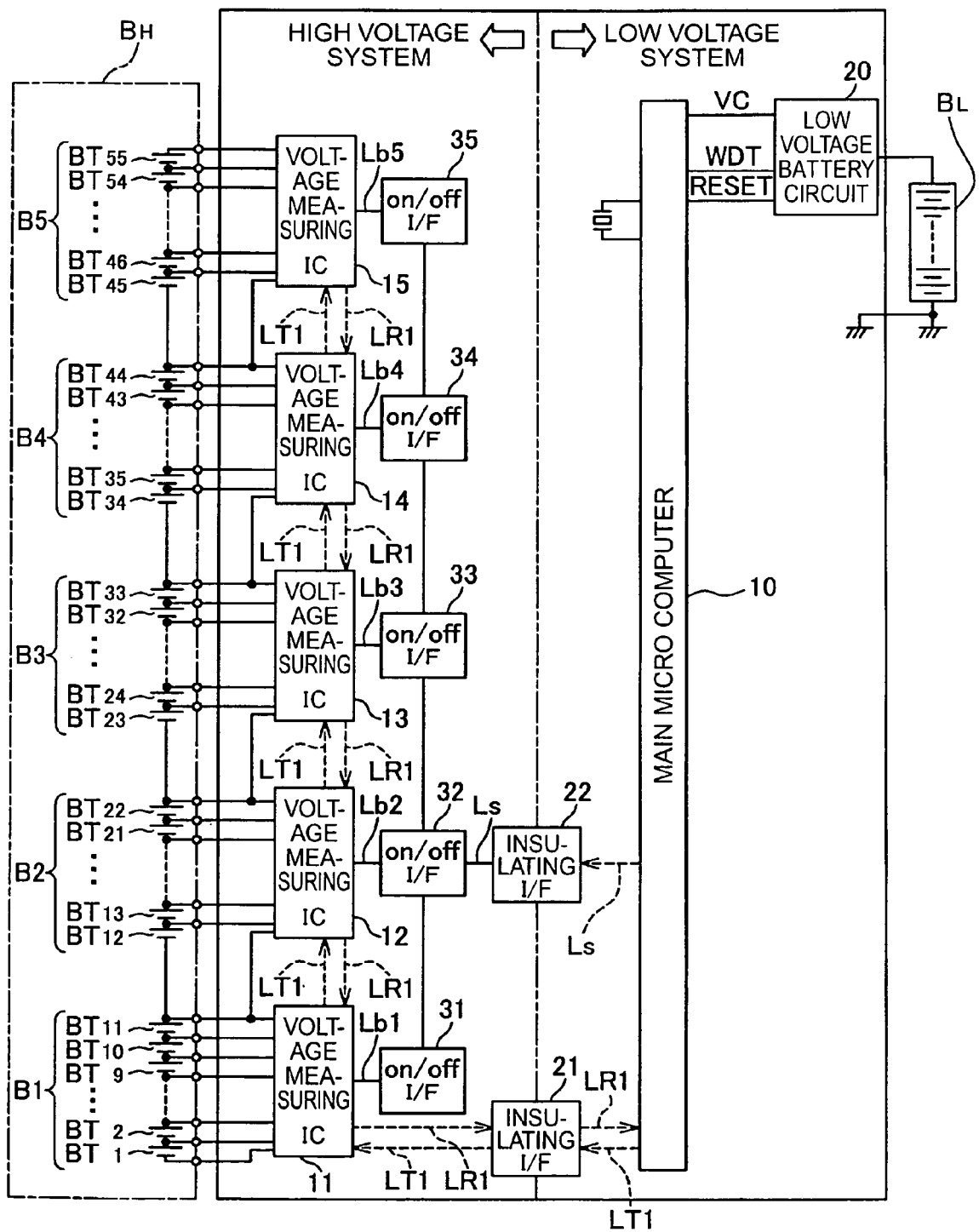
FIG. 1 is a circuit diagram showing an embodiment of a voltage measuring device in which a disconnection detecting device of the present invention is embedded.

Further, a reference mark $B_H$ in FIG. 1 indicates the high voltage battery. The high voltage battery $B_H$ is used as a battery for an electric motor of an HEV using both an engine and the electric motor as a driving force. The electric motor as a load and a generator are connected as necessary to both ends of the high voltage battery $B_H$.

The high voltage battery $B_H$ is divided, for example, to five blocks B1 to B5. Each block B1 to B5 is respectively composed of, for example, eleven unit cells $BT_1$ to $BT_{11}$, $BT_{12}$ to $BT_{22}$, $BT_{23}$ to $BT_{33}$, $BT_{34}$ to $BT_{44}$, and BT45 to $BT_{55}$. The unit cells $BT_1$ to $BT_{55}$ are respectively composed of one secondary battery.

A voltage measuring device includes a main microcomputer 10 as a switch control device, and voltage measuring ICs 11 to 15 as voltage measuring devices. The main microcomputer 10 is composed of a widely known CPU, a ROM, a RAM and the like. A low voltage battery circuit 20 supplies the battery to the main microcomputer 10. The main microcomputer 10 controls the voltage measuring ICs 11 to 15. The low voltage battery circuit 20 generates an operating voltage VC for the main microcomputer 10 from a supply voltage of the low voltage battery $B_L$.

Figure 2:
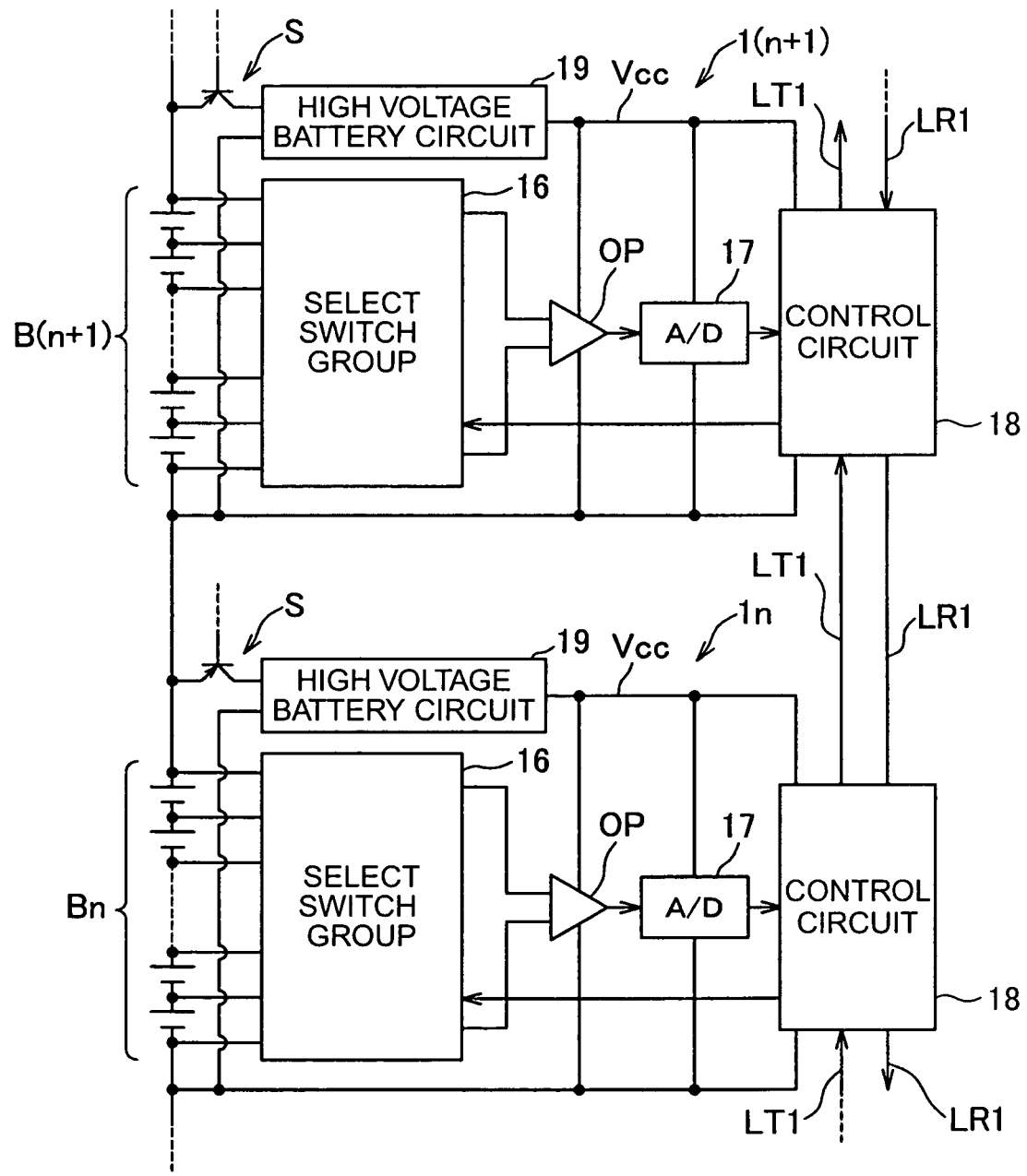
FIG. 2 is a circuit diagram showing a detail of a voltage measuring IC shown in FIG. 1.

The voltage measuring ICs 11 to 15 are provided respectively corresponding to the blocks B1 to B5. As shown in FIG. 2, the battery is only supplied to the voltage measuring ICs 11 to 15 from the corresponding unit cells $BT_1$ to $BT_{11}$, $BT_{12}$ to $BT_{22}$, $BT_{23}$ to $BT_{33}$, $BT_{34}$ to $BT_{44}$, $BT_{45}$ to $BT_{55}$ of the corresponding blocks B1 to B5. Namely, the ground levels of the voltage measuring ICs 11 to 15 are the most negative levels of the corresponding blocks B1 to B5, and are different from each other. Therefore, breakdown voltage of the devices composing the voltage measuring ICs 11 to 15 can be reduced.

Each of the voltage measuring ICs 11 to 15 includes: a select switch group 16; a differential amplifier OP; an A/D convertor 17; a control circuit 18; a high voltage battery circuit 19; and a break switch S. The select switch group 16 is composed of normally open switches respectively provided at both ends of each of the unit cells $BT_1$ to $BT_{55}$, and connects both ends of one of the unit cells $BT_1$ to $BT_{55}$ to the differential amplifier OP. The differential amplifier OP outputs the voltage between both ends of one of the unit cells $BT_1$ to $BT_{55}$ selected by the select switch group 16 to the A/D convertor 17. The A/D convertor 17 converts the voltage between both ends of one of the unit cells $BT_1$ to $BT_{55}$ outputted from the differential amplifier OP to the digital format and outputs to the control circuit 18.

The control circuit 18 is composed of a widely known CPU, a ROM, a RAM and the like, and controls the whole operations of the voltage measuring ICs 11 to 15. The high voltage battery circuit 19 generates an operating voltage Vcc of the differential amplifier OP, the A/D convertor 17, and the control circuit 18 from the supply voltage of each of the blocks B1 to B5. The break switch S is provided between an anode side of each of the blocks B1 to B5 and the high voltage battery circuit 19. The break switch S switches on/off the supply of the voltage between both ends of the blocks B1 to B5 to the high voltage battery circuit 19 so as to switch on/off the power supply to the voltage measuring ICs 11 to 15. The break switch is, for example, composed of a PNP transistor.

Further, as shown in FIG. 1, the voltage measuring device includes: a first transmitting line LT1; a first receiving line LR1; and a first insulating interface (I/F) 21 as a first communicating line. The first transmitting line LT1 and the first receiving line LR1 are so arranged that the voltage measuring ICs 11 to 15 are connected in series. Because ground levels of the voltage measuring ICs 11 to 15 are different from each other, it is necessary to provide a level shift circuit (not shown) in the first transmitting line LT1 and in the first receiving line LR1.

Further, the first transmitting line LT1 and the first receiving line LR1 are so arranged that a bottom voltage measuring IC 11 of the voltage measuring ICs 11 to 15 is connected to the main microcomputer 10. Namely, the first transmitting line LT1 and the first receiving line LR1 are so arranged that the main microcomputer 10, the voltage measuring IC 11, the voltage measuring IC 12, the voltage measuring IC 13, the voltage measuring IC 14, and the voltage measuring IC 15 are arranged in series.

The first insulating I/F 21 is disposed on the first transmitting line LT1 and the first receiving line LR1 which are interposed between the bottom voltage measuring IC 11 and the main microcomputer 10. The first insulating I/F 21 connects the voltage measuring IC 11 and the main microcomputer 10 while they are electrically isolated from each other. Owing to the first insulating I/F 21, the bottom voltage measuring IC 11 and the main microcomputer 10 can communicate with each other while they are electrically isolated from each other. Thus, the high voltage battery $B_H$ is electrically isolated from the low voltage battery $B_L$. A photo coupler composed of a light-emitting device and a light-receiving device, and a magnetic coupler are widely known as the first insulating I/F 21.

Figure 3:
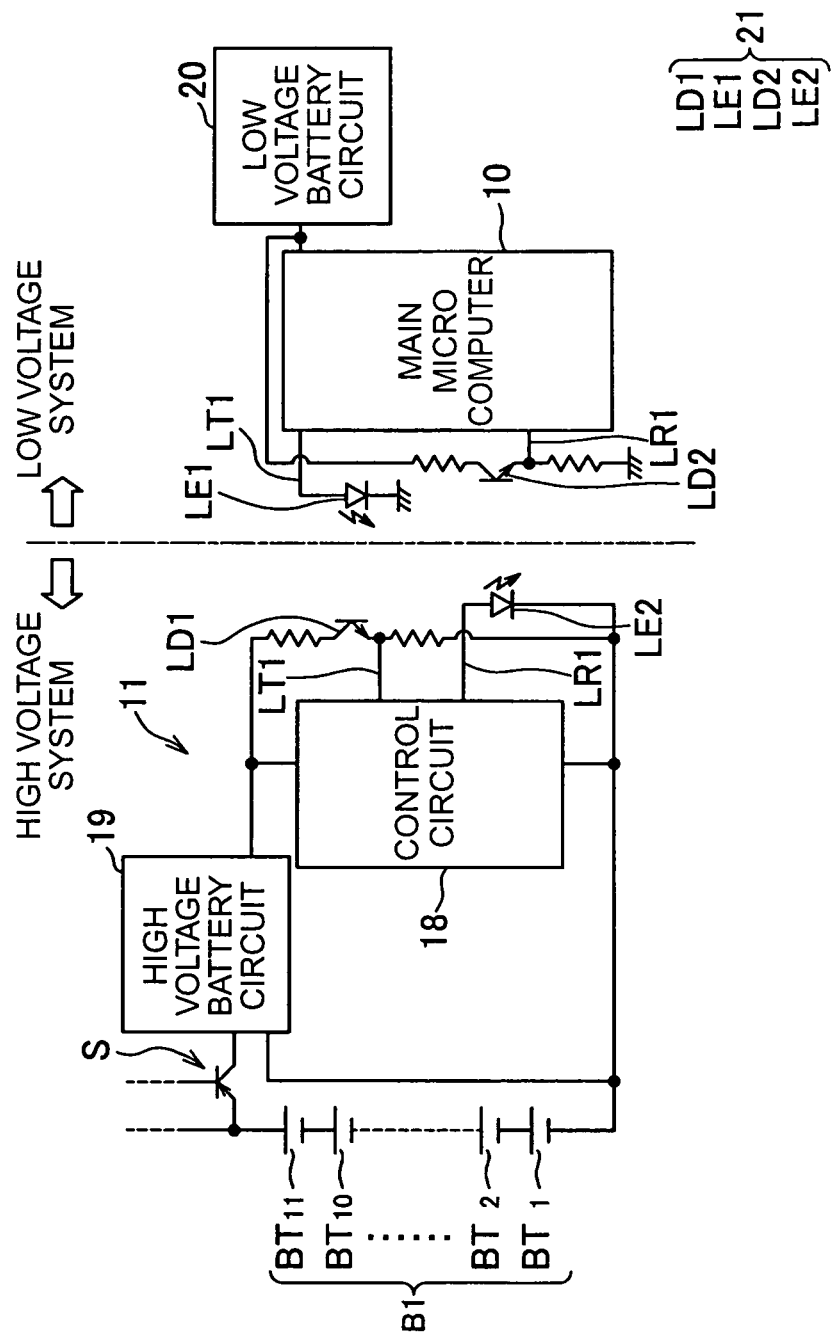
FIG. 3 is a detailed electric wiring diagram when using a photo coupler as a first insulating interface shown in FIG. 1.

FIG. 3 shows a detailed electric wiring diagram of the voltage measuring device shown in FIG. 1 when using a photo coupler as the first insulating I/F 21. In this figure, a detailed description of the voltage measuring IC 11 and the like are omitted. As shown in FIG. 3, the first insulating I/F 21 includes: a light-emitting device LE1 and a light-receiving device LD2 provided at a low voltage system; and a light-emitting device LE2 and a light-receiving device LD1 provided at a high voltage system. As shown in FIG. 3, an end of the light-emitting device LE1 is connected to the main microcomputer 10, and the other end of the light-emitting device LE1 is connected to the ground. When an electric signal is outputted from the main microcomputer 10, the light-emitting device LE1 emits light.

On the other hand, the light-receiving device LD1 is interposed between a high voltage battery circuit of the block B1 and a cathode of the unit cell $BT_1$. When receiving the light from the light-emitting device LE1, the light-receiving device LD1 turns on and supplies an electric signal to a control circuit 18 via the first transmitting line LT1. According to the above configuration, an electric signal can be sent to the control circuit 18 of the block B1 while the electric signal is electrically isolated from the main microcomputer 10.

Further, an end of the light-emitting device LE2 is connected to the control circuit 18, and the other end of the light-emitting device LE2 is connected to a cathode of the unit cell $BT_1$. When an electric signal is outputted from the control circuit 18, the light-emitting device LE2 emits light. On the other hand, the light-receiving device LD2 is interposed between the low voltage battery circuit 20 and the ground. When receiving the light from the light-emitting device LE2, the light-receiving device LD2 turns on and supplies an electric signal to the main microcomputer 10 via the first receiving line LR1. According to the above configuration, an electric signal can be sent to the main microcomputer 10 while the electric signal is electrically isolated from the control circuit 18 of the block B1.

Figure 4:
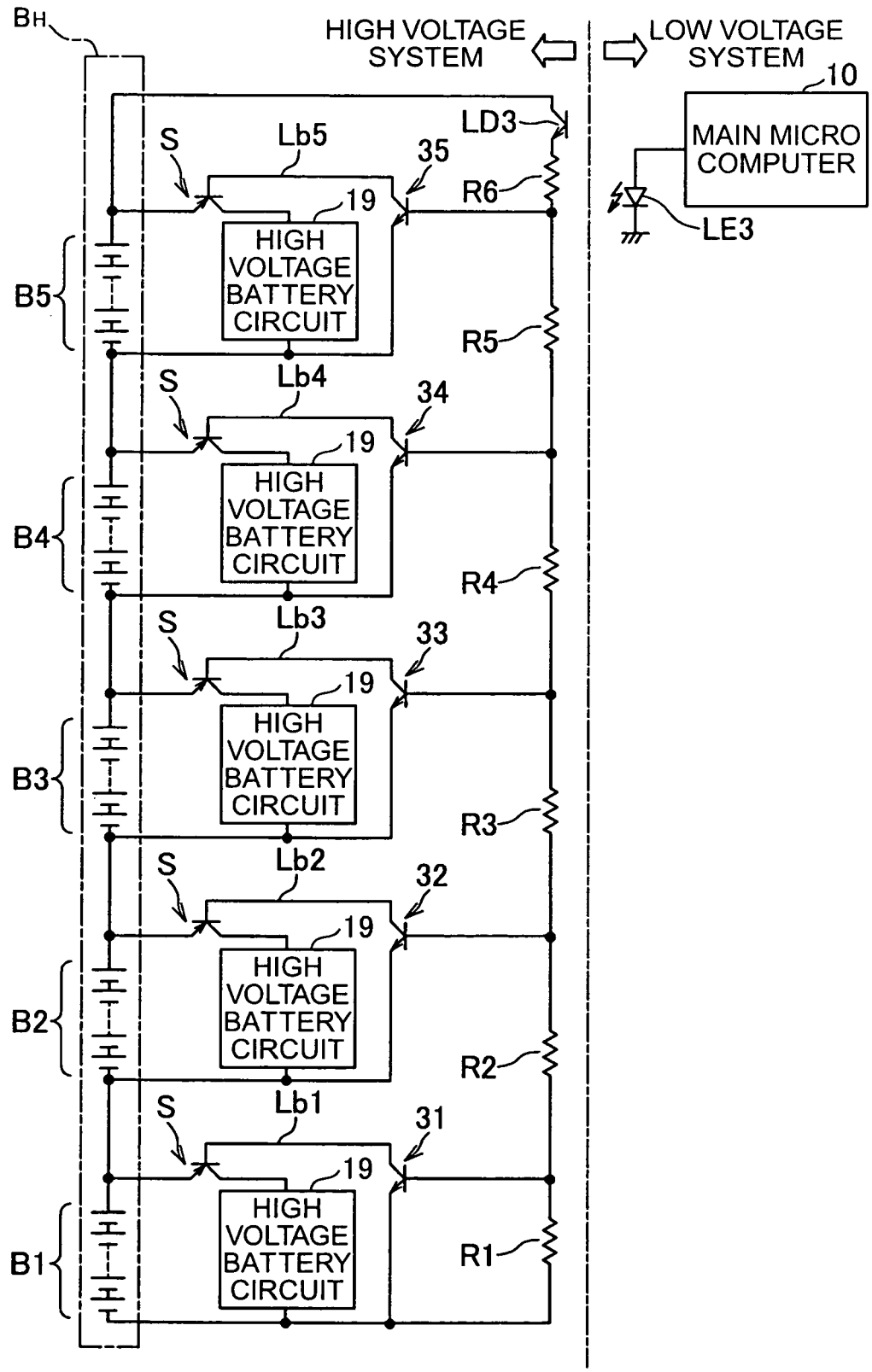
FIG. 4 is a detailed electric wiring diagram when using a photocoupler as a second insulating interface shown in FIG. 1.

Further, as shown in FIG. 1, the voltage measuring device includes: a second transmitting line LT2; a second insulating I/F 22; and on/off I/F 31 to 35 as a second communicating line. Using these, the break switch S can be turned on corresponding to an output of a battery signal from the main microcomputer 10. Namely, the second transmitting line LT2 is interposed between a base of a PNP transistor composing the break switch and the main microcomputer 10. The second transmitting line LT2 is composed of a main line Ls of which one end is connected to the main microcomputer 10, and a plurality of branch lines Lb1 to Lb5 which are branched from the other end of the main line Ls. As shown in FIG. 4, the other end of each of the branch lines Lb1 to Lb5 is connected to the base of the PNP transistor composing the break switch.

As shown in FIG. 1, the second insulating I/F 22 is provided on the main line Ls, and connects the break switch S and the main microcomputer 10 while they are electrically isolated from each other. Thus, the high voltage battery $B_H$ is electrically isolated from the low voltage battery $B_L$. A photo coupler composed of a light-emitting device and a light-receiving device, and a magnetic coupler are widely known as the second insulating I/F 22. The on/off I/Fs 31 to 35 respectively correspond to the branch lines Lb1 to Lb5, and convert a battery signal sent from the main microcomputer 10 into a suitable signal level for on/off the break switch.

Next, a detailed configuration of the second transmitting line LT2, the second insulating I/F 22, and the on/off I/Fs 31 to 35 as the second communicating line will be explained with reference to FIG. 4. As shown in FIG. 4, the second insulating I/F 22 includes: a light-emitting device LE3 provided at the low voltage system; and a light-receiving device LD3 provided at the high voltage system. As shown in FIG. 4, an end of the light-emitting device LE3 is connected to the main microcomputer 10, and the other end of the light-emitting device LE3 is connected to the ground. When the battery signal is outputted from the main microcomputer 10, the light-emitting device LE3 emits light.

On the other hand, an end of the light-receiving device LD3 is connected to an anode of a top block B5, and the other end of the light-receiving device LD3 is connected to a cathode of a bottom block B1 via voltage-dividing resistors R1 to R6. A connecting point between the voltage-dividing resistors R1 and R2 is connected to a base of an NPN transistor composing the on/off I/F 31. A connecting point between the voltage-dividing resistors R2 and R3 is connected to a base of an NPN transistor composing the on/off I/F 32. A connecting point between the voltage-dividing resistors R3 and R4 is connected to a base of an NPN transistor composing the on/off I/F 33. A connecting point between the voltage-dividing resistors R4 and R5 is connected to a base of an NPN transistor composing the on/off I/F 34. A connecting point between the voltage-dividing resistors R5 and R6 is connected to a base of an NPN transistor composing the on/off I/F 35.

An emitter of the NPN transistor composing the on/off I/Fs 31 to 35 is connected to a cathode of each of blocks B1 to B5. A collector of the NPN transistor composing the on/off I/Fs 31 to 35 is connected to the base of the PNP transistor composing the break switch S. According to the above configuration, when the main microcomputer 10 supplies the battery signal to the light-emitting device LE3, the light-emitting device LE3 emits light. When receiving the light from the light-emitting device LE3, the light-receiving device LD3 turns on and resultingly the NPN transistors composing the on/off I/Fs 31 to 35 turn on. Then, when the on/off I/Fs 31 to 35 turn on, the PNP transistors composing the break switches turn on, and the battery is supplied to the voltage measuring ICs 11 to 15. Namely, the supply of the battery signal from the main microcomputer 10 controls on/off of the voltage measuring ICs 11 to 15.

Figure 5:
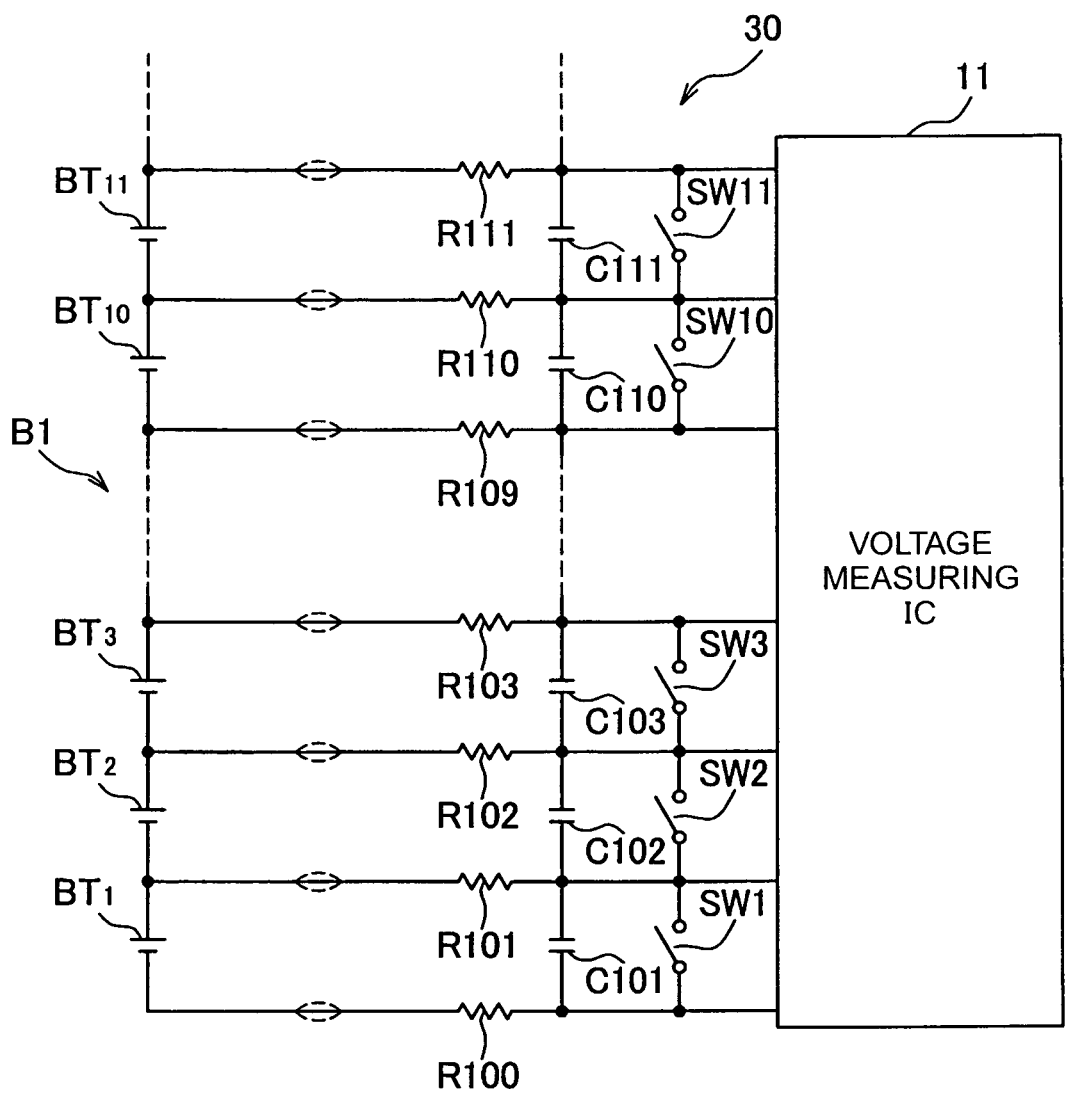
FIG. 5 is a detailed circuit diagram between unit cells $BT_1$ to $BT_{11}$ and the voltage measuring IC 11 shown in FIG. 1.

Next, a configuration of a disconnection detecting device 30 embedded in the voltage measuring device will be explained with reference to FIG. 5. The disconnection detecting device 30 detects a disconnection of an electric path connecting both ends of each of the unit cells $BT_1$ to $BT_{55}$ with the voltage measuring ICs 11 to 15. As shown in FIG. 5, in the block B1, the disconnection detecting device 30 includes: resistors R100 to R111; a plurality of switching elements SW1 to SW11; a plurality of capacitors C101 to C111.

A plurality of resistors R100 to R111 are respectively provided between both ends of the unit cells $BT_1$ to $BT_{11}$ and the voltage measuring IC 11. The connecting points of the adjacent unit cells $BT_1$ to $BT_{11}$ are connected to the voltage measuring IC 11 via the common resistors R100 to R111. Therefore, the number of the resistors R100 to R111 is the number of the unit cells $BT_1$ to $BT_{11}$ plus one. The switching elements SW1 to SW11 are respectively connected parallel to the unit cells $BT_1$ to $BT_{11}$ via the resistors R100 to R111.

The capacitors C101 to C111 are respectively connected parallel to the unit cells $BT_1$ to $BT_{11}$ via the resistors R100 to R111. The number of the switching elements SW1 to SW11 and the number of the capacitors C101 to C111 are the same as the number of the unit cells $BT_1$ to $BT_{11}$. The resistors R100 to R111 and the capacitors C101 to C111 compose a noise filter circuit to remove noise from the voltage between both ends of each of the unit cells $BT_1$ to $BT_{11}$. Further, the resistors R100 to R111 and the switching elements SW1 to SW11 compose bypass circuits to discharge the unit cells $BT_1$ to $BT_{11}$. Namely, when the switching elements SW1 to SW11 corresponding to the unit cells $BT_1$ to $BT_{11}$ having high voltages between both ends thereof turn on to discharge the unit cells $BT_1$ to $BT_{11}$, the voltages between both ends of the unit cells $BT_1$ to $BT_{11}$ are equalized. Because the configurations of the blocks B2 to B5 are the same as that of the block B1, the detailed explanations of the blocks B2 to B5 are omitted.

Figure 6A:
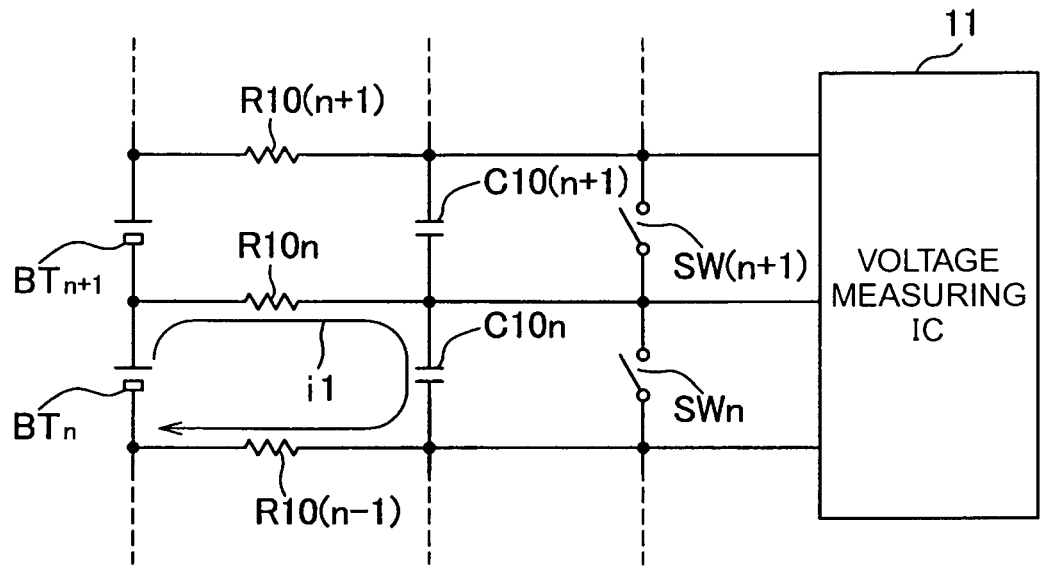
FIG. 6A is a circuit diagram showing a charge current at a normal mode.

Next, a disconnection detecting principle of the disconnection detecting device 30 embedded in the voltage measuring device will be explained with reference to FIGS. 6A, 6B and 7. For simplifying the explanation, only the block B1 connected to the voltage measuring IC 11 will be explained, however, much the same is true on the blocks B2 to B5. When the switching element SWn (where n is an arbitrary integer) turns on, the capacitor C10$n$ is discharged and the voltage between both ends of the capacitor C10$n$ becomes zero. Then, as shown in FIG. 6A, in a case that the electric path is normal and not disconnected, when the switching element SWn turns off, charge current i1 is supplied to the capacitor C10$n$ via the resistor R10$n$ from the unit cell BTn to charge the capacitor C10$n$. Thus, as shown by a solid line in FIG. 7, the voltage between both ends of the capacitor 10$n$ is rapidly raised to the voltage E between both ends of the unit cell BTn, and keeps the voltage E.

Figure 6B:
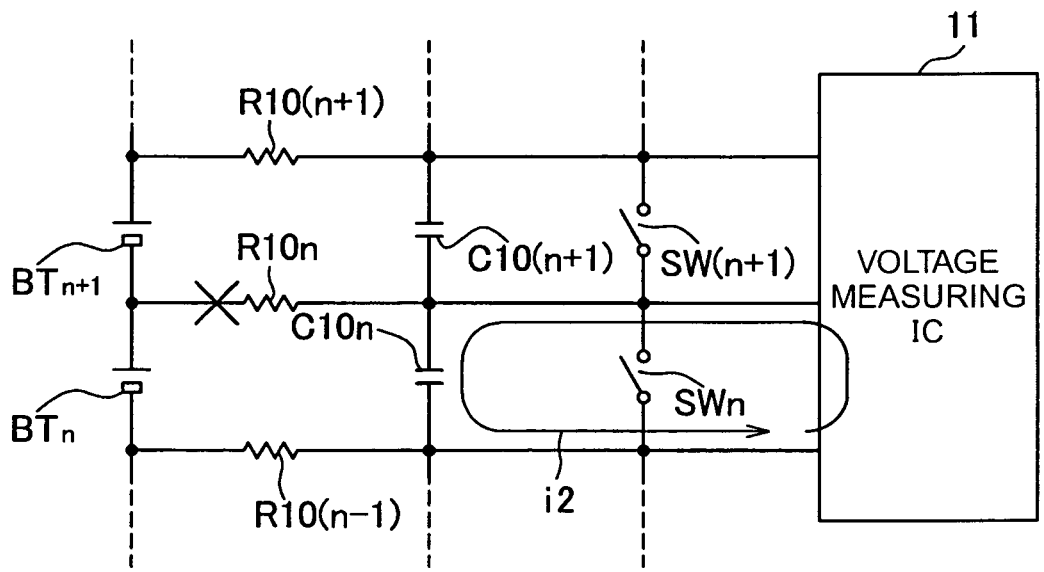
FIG. 6B is a circuit diagram showing the charge current at a disconnecting mode.

On the other hand, as shown in FIG. 6B, in a case that the electric path between an anode of the unit cell BTn and the voltage measuring IC 11 is disconnected, when the switching element SWn turns off, slight leak current i2 from the voltage measuring IC 11 charges the capacitor C10$n$. Thus, as shown by a chain line in FIG. 7, the voltage between the capacitor C10$n$ is slowly raised to a constant value.

In more detail, in the case that the electric path is normal, the charge current i1 from the unit cell BTn charges the capacitor C10$n$ via the resistor R10$n$. Therefore, the capacitor C10$n$ is charged with a time constant determined by the resistor R10$n$ and the capacitor C10$n$. On the other hand, in the case that the electric path is disconnected, the leak current i2 from the voltage measuring IC 11 charges the capacitor C10$n$. Therefore, the capacitor C10$n$ is charged with a time constant determined by an internal impedance of the voltage measuring IC 11 and the capacitor C10$n$.

Resistance values of the resistor R100 to R111 are smaller than the internal impedance of the voltage measuring IC 11. For example, when the internal impedance of the voltage measuring IC 11 is more than 100 k ohms, the resistance values of the resistor R100 to R111 are less than several hundred ohms. Therefore, the charge time constant of the capacitor C10$n$ at the normal condition is less than the charge time constant of the capacitor C10$n$ at the disconnect condition. Therefore, as shown in FIG. 7, the voltage between both ends of the capacitor C10$n$ at the normal condition is raised faster than that at the disconnect condition and becomes constant.

Now, the time it takes that the voltage between both ends of the capacitor C10$n$ becomes substantially the same as the voltage between both ends of the unit cell BTn from zero after the switching element SWn turns off at the normal condition is defined as T1. the time it takes that the voltage between both ends of the capacitor C10$n$ becomes substantially the same as the voltage between both ends of the unit cell BTn from zero after the switching element SWn turns off at the disconnect condition is defined as T2.

Figure 7:
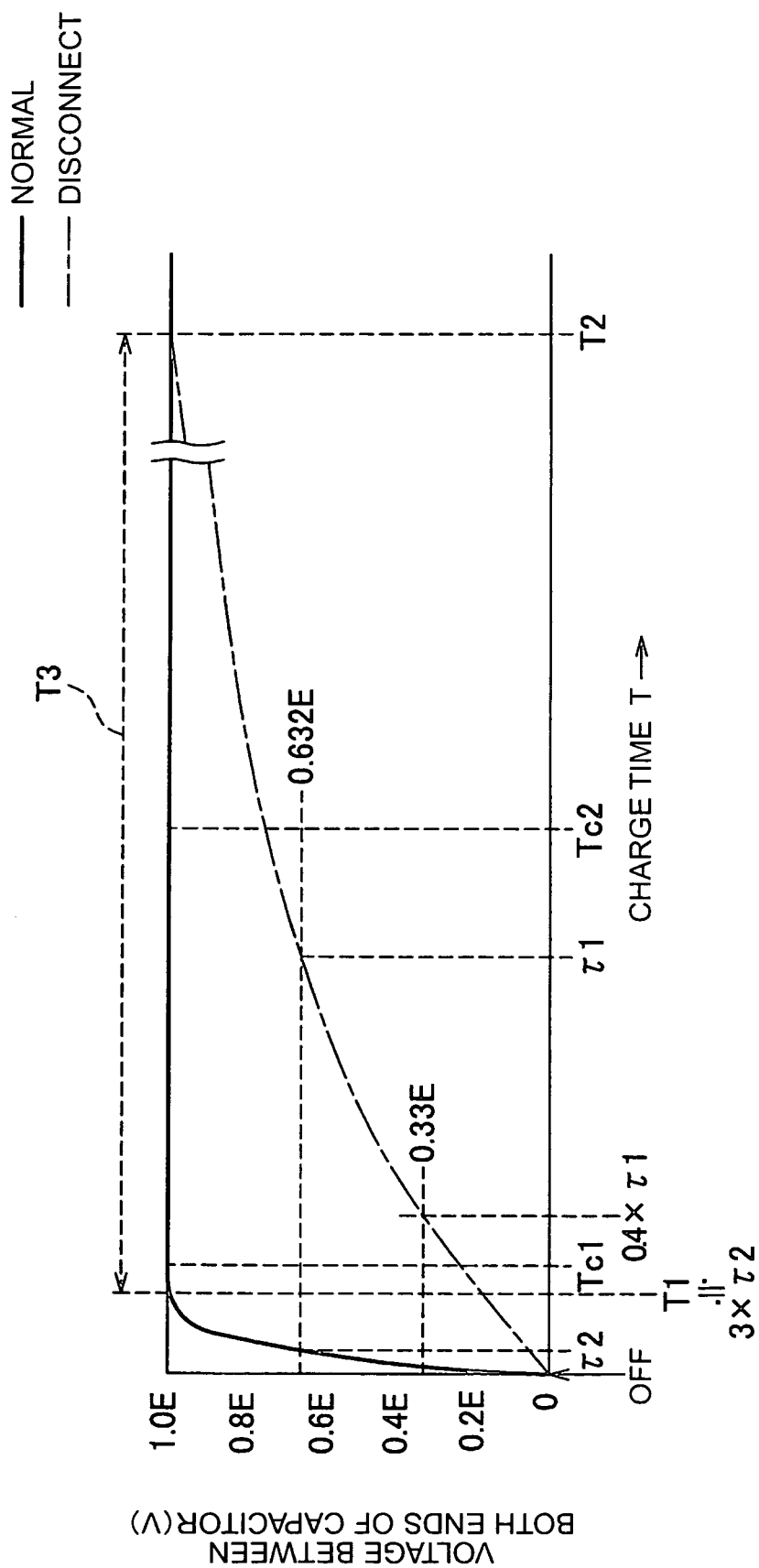
FIG. 7 is a time chart showing voltages between both ends of a capacitor at the normal mode and the disconnecting mode for explaining an operation of a first embodiment.

As shown in FIG. 7, in the period T3 which is longer than T1 and shorter than T2, the voltage between both ends of the capacitor C10$n$ at the normal condition is substantially constant. On the other hand, the voltage between both ends of the capacitor C10$n$ at the disconnect condition is gradually increased. Therefore, by calculating a change rate of the voltage between both ends of the capacitor C10$n$ in the period T3, we can judge that when the change rate is nearly zero, the electric path is normal, and that when the change rate is large, the electric path is disconnected.

In detail, the voltage V1 between both ends of the capacitor C10$n$ at the first predetermined time Tc1 which has passed from the time when the switching element SWn turns off in within the time period T3 is measured, and the voltage V2 between both ends of the capacitor C10$n$ at the second predetermined time Tc2 which is longer than the first predetermined time Tc1, and has passed from the time when the switching element SWN turns off is measured. Then, the change rate V1/V2 is calculated. When the change rate V1/V2 is less than the first threshold value, the disconnection of the electric path can be detected.

Incidentally, the first predetermined time Tc1 is set as near the time T1 as possible, and the second predetermined time Tc2 is set as near the time T2 as possible. Then, the change rate V1/V2 at the disconnect condition is reduced, and the difference between the change rates at the normal condition and at the disconnect condition becomes large, so that the disconnection can be detected more correctly.

Next, settings of the first predetermined time Tc1 and the second predetermined time Tc2 will be explained in detail. Now, the charge time constant of the capacitor C10$n$ at the disconnect condition determined by the internal impedance of the voltage measuring IC 11 and the capacitor C10$n$ is defined as $\tau 1$. The charge time constant of the capacitor C10$n$ at the normal condition determined by the resistor R10$n$ and the capacitor C10$n$ is defined as $\tau 2$. As shown in FIG. 7, when the time has passed more than the time constant $\tau 1$ from the time when the switching element SWn turns off at the disconnect condition, the voltage between both ends of the capacitor C10$n$ becomes more than 0.632*the voltage E between both ends of the unit cell BTn.

On the other hand, at the disconnect condition, before 0.4*time constant $\tau 1$ has passed from the time when the switching element SWn turns off, the voltage between both ends of the capacitor C10$n$ becomes less than 0.33*the voltage E between both ends of the unit cell BTn. Further, it is known that the time T1 is substantially equal to 3*time constant $\tau 2$. Therefore, the first predetermined time Tc1 is set more than 3*time constant $\tau 2$, and less than 0.4*time constant $\tau 1$, and the second predetermined time Tc2 is set more than the time constant $\tau 1$, and then, the change rate V1/V2 at the disconnect condition is less than 0.5 ($\cong$0.33/0.632). Therefore, if the change rate V1/V2 is less than 0.5 (first threshold value), the electric path can be judged disconnected. If the change rate V1/V2 is more than 0.5, the electric path can be judged normal.

Figure 8:
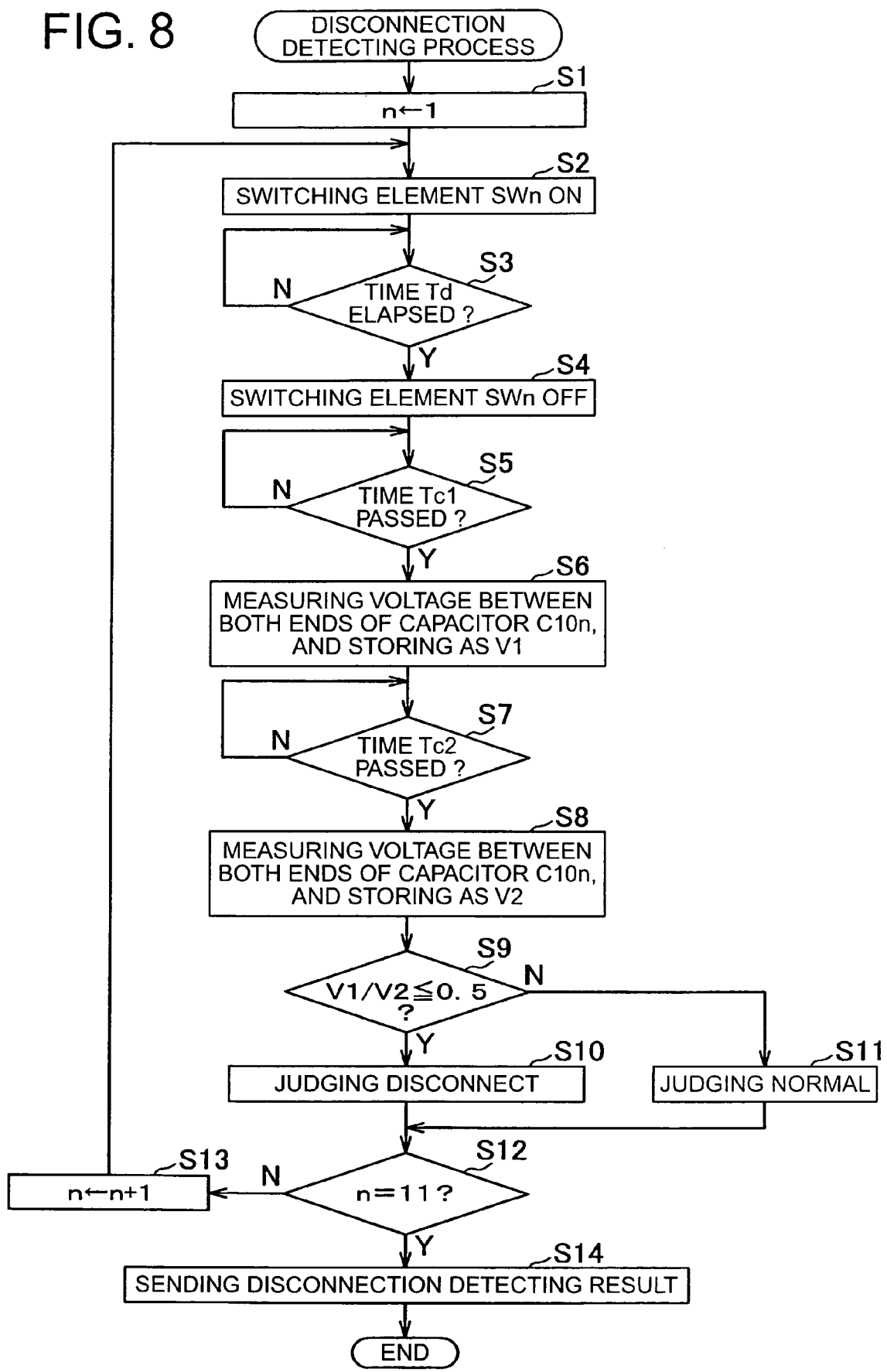
FIG. 8 is a flowchart showing a disconnection detecting procedure of a control circuit shown in FIG. 2 according to the first embodiment.

A disconnection detecting process of the voltage measuring device will be explained based on the above-described disconnection detecting principle with reference to FIG. 8. In the disconnection detecting process, firstly, the control circuit 18 sets n to 1 (step S1). Then, the control circuit 18 turns on the switching element SWn (step S2). The control circuit 18 waits for an elapsed time Td from the turning on of the switching element SWn ("Y" in step S3), then turns off the switching element SWn (step S4). Time Td is the time where the voltage between both ends of the capacitor C10$n$ becomes zero after the switching element SWn is turned on and the capacitor C10$n$ is discharged. Therefore, just after the switching element SWn is turned off at step 4, the voltage between both ends of the capacitor C10$n$ is zero. Then, when the switching element SWn is turned off, the capacitor C10$n$ is charged by the charge current i1 from the unit cell BTn or by the leak current from the voltage measuring IC 11. According to the above, in step S2 to S4, the control circuit 18 works as a switch control device.

Next, the control circuit 18 waits for the first predetermined time Tc1 which is longer than 3*time constant $\tau 2$, and shorter than 0.4*time constant τ1 as shown in FIG. 7 from the time when the switching element SWn is turned off ("Y" in step S5), then works as a first capacitor voltage measuring device to measure a voltage between both ends of the capacitor C10n, and store the voltage as the voltage V1 in the RAM (step S6). Namely, the control circuit 18 controls select switch group 16, and connects the both ends of the unit cell BTn, namely, the both ends of the capacitor C10n to the differential amplifier OP. Thus, the voltage between both ends of the capacitor C10n is supplied from the differential amplifier OP via the A/D convertor 17 to the control circuit 18.

The control circuit 18 takes in the voltage between both ends of the supplied capacitor C10n and stores the voltage as V1 in the not-shown RAM. Then, after the control circuit 18 turns off the switching element SWn, the control circuit 18 waits for the second predetermined time Tc2 which is longer than the first predetermined time Tc1 ("Y" in step S7), then works as a second capacitor voltage measuring device to measure the voltage between both ends of the capacitor C10n, and stores the voltage as V2 in the RAM (step S8). Then, the control circuit 18 works as a disconnection detecting unit to calculate the change rate (V1/V2). If the calculated change rate (V1/V2) is equal to or less than 0.5 ("Y" in step 9), the control circuit 18 judges that the electric path between the unit cell BTn and the voltage measuring IC 11 is disconnected, and stores it as the disconnection detecting result in the RAM (step S10).

On the other hand, if the calculated change rate (V1/V2) is more than 0.5 ("N" in step S9), the control circuit 18 judges that the electric path between the unit cell BTn and the voltage measuring IC 11 is normal, and stores it as the disconnection detecting result in the RAM (step S11). Next, the control circuit 18 judges whether n reaches 11 or not (step S12). If n is less than 11 ("N" in step S12), the control circuit 18 increments n (step S13), then the process goes back to step S2.

On the other hand, if n reaches 11 ("Y" in step S11), the control circuit 18 judges that all the electric paths between all the unit cells $BT_1$ to $BT_{11}$ composing the block B1 and the voltage measuring IC 11 are checked, and sends the disconnection detecting results stored in the RAM at steps 10 and 11 to the main microcomputer 10 (step S14). Then, the process ends. The control circuits 18 of the blocks B2 to B5 also perform the disconnecting detecting process similarly. The main microcomputer 10 receives the disconnection detecting results of the blocks B1 to B5, and if the control circuit 18 judges that there is a disconnection, the control circuit 18 informs the user accordingly.

According to the first embodiment, the control circuit 18 turns on the switching element SWn to discharge the capacitor C10n, and after the voltage between both ends of the capacitor C10n is zero, the switching element SWn is turned off. Further, after the first predetermined time Tc1 is passed and after the second predetermined time Tc2 is passed from the time when the control circuit 18 turns off the switching element SWn, the voltages between both ends of the capacitor C10n are measured as V1 and V2. If the change rate (V1/V2) is equal to or less than 0.5, the electric path is judged disconnected. Thus, by using the resistors R100 to R111 for equalizing by discharging the unit cells $BT_1$ to $BT_{55}$, the switching elements SW1 to SW11, and the noise filter capacitor C101 to C111, the disconnection can be detected. Therefore, a low-cost disconnection detecting device can be realized by preventing an increase of the electric components.

Further, according to the first embodiment, the first predetermined time Tc1 is longer than 3*time constant τ2. Therefore, under the normal condition, after the first predetermined time Tc1 is passed, the voltage between both ends of the capacitor C10n is substantially equal to the voltage between both ends of the unit cell BTn. Further, the first predetermined time Tc1 is shorter than 0.4*time constant τ1, and the second predetermined time Tc2 is longer than time constant τ1. According to this, in a case that the electric path is disconnected, after the first predetermined time Tc1 is passed, the voltage between both ends of the capacitor C10n is equal to or less than 0.33*the voltage E between both ends of the unit cell BTn, and after the second predetermined time Tc2 is passed, the voltage between both ends of the capacitor C10n is equal to or more than 0.632*the voltage E between both ends of the unit cell BTn. Therefore the change rates V1/V2 at the disconnection condition and the normal condition are greatly different from each other. Therefore, the disconnection detection is correctly performed.

Incidentally, in the first embodiment, the first threshold value is 0.5. However, the present invention is not limited to this. In a case that the first predetermined value Tc1 is more than 3*time constant τ2, and less than 0.4*time constant τ1, and the second predetermined time Tc2 is less than time constant τ1, the first threshold value may be equal to or less than 0.5.

Further, in the first embodiment, when the change rate (V1/V2) is equal to or less than 0.5 (first threshold value), the disconnection is detected. However, the present invention is not limited to this. For example, when the change value (V1/V2) is equal to or more than the second threshold value, the disconnection may be detected. In this case, similar to the first embodiment, the first predetermined value Tc1 is more than 3*time constant τ2, and less than 0.4*time constant τ1, and the second predetermined time Tc2 is less than time constant τ1, then, the change rate (V1/V2) at the disconnection condition is equal to or more than 2. Therefore, the second threshold value may be equal to or more than 2.

Second Embodiment

Figure 9:
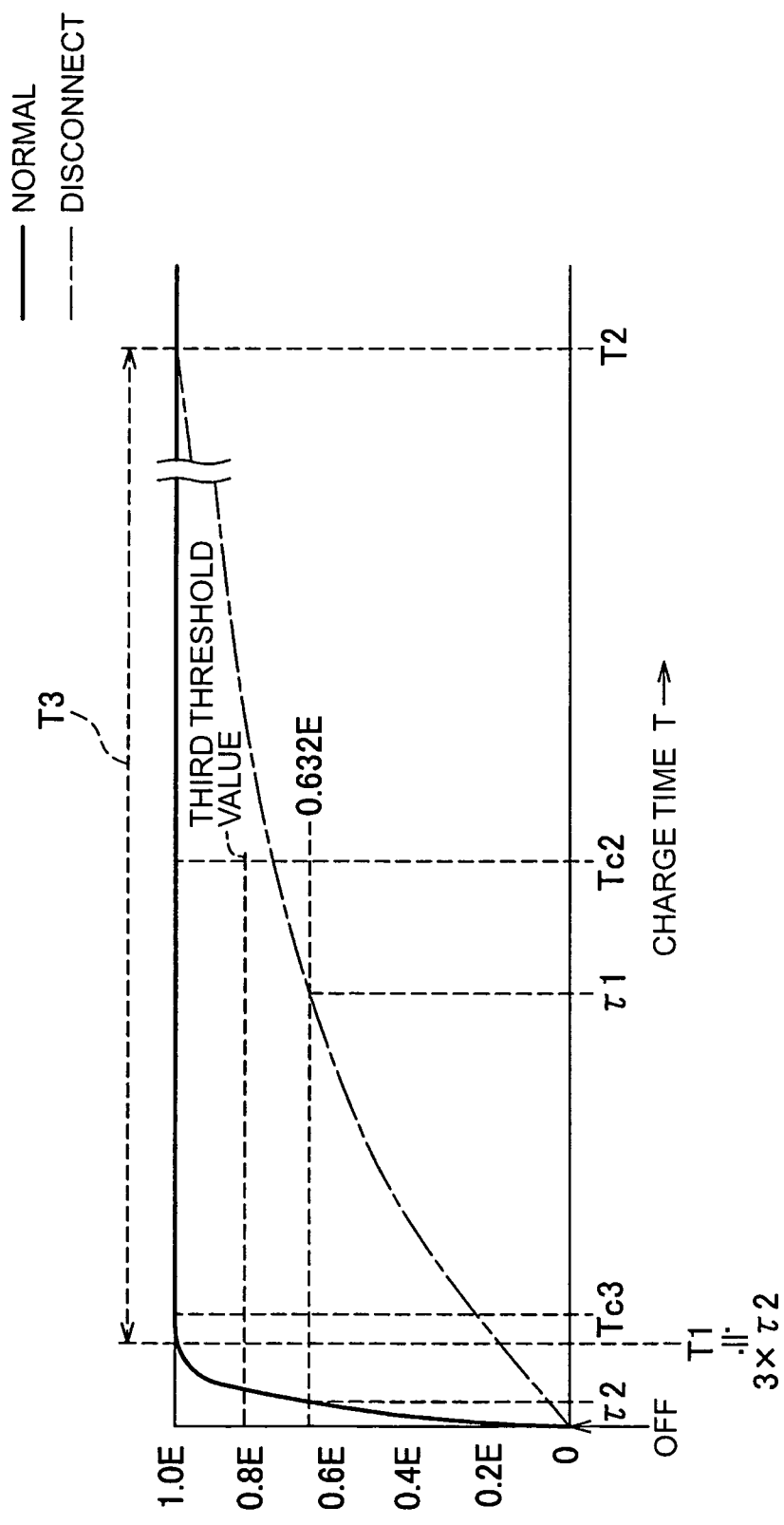
FIG. 9 is a time chart showing voltages between both ends of a capacitor at the normal mode and the disconnecting mode for explaining an operation of a second embodiment.

Next, a second embodiment will be explained. A configuration of the voltage measuring device according to the second embodiment is similar to that of the first embodiment. Therefore, a detailed explanation is omitted. Firstly, a disconnection detecting principle of the disconnection detecting device 30 embedded in the voltage measuring device will be explained with reference to FIG. 9. For simplifying the explanation, only the block B1 connected to the voltage measuring IC 11 will be explained, however, much the same is true on the blocks B2 to B5.

In the first embodiment, the disconnection is detected based on the change rate (V1/V2) of the voltage between both ends of the capacitor C10n. In the second embodiment, when the voltage between both ends of the capacitor C10n after a third predetermined time Tc3 is passed from the time when the switching element SWn is turned off is equal to or less than a third threshold value, the disconnection is detected. The third threshold time Tc3 is longer than 3*time constant τ2, and shorted than time constant τ1.

When the third predetermined time Tc3 is set as such, under the disconnection condition, the voltage between both ends of the capacitor C10n after the third threshold time Tc3 is passed is equal to or less than 0.632*the voltage E between both ends of the unit cell BTn. 0.632*the voltage E between both ends of the unit cell BTn is larger than the minimum voltage between both ends of the unit cell BTn under the normal condition. On the other hand, because under the normal condition, the voltage between both ends of the capacitor C10n after the third predetermined time Tc3 is passed is substantially equal to the voltage between both ends of the unit cell BTn, the voltage between both ends of the capacitor C10n is more than the minimum voltage between both ends of the unit cell BTn under the normal condition. Accordingly, as described the above, when the third predetermined time Tc3 is longer than 3*time constant τ2, and shorted than time constant τ1, the disconnection is detected when the voltage between both ends of the capacitor C10n is equal to or less than the third threshold value.

Figure 10:
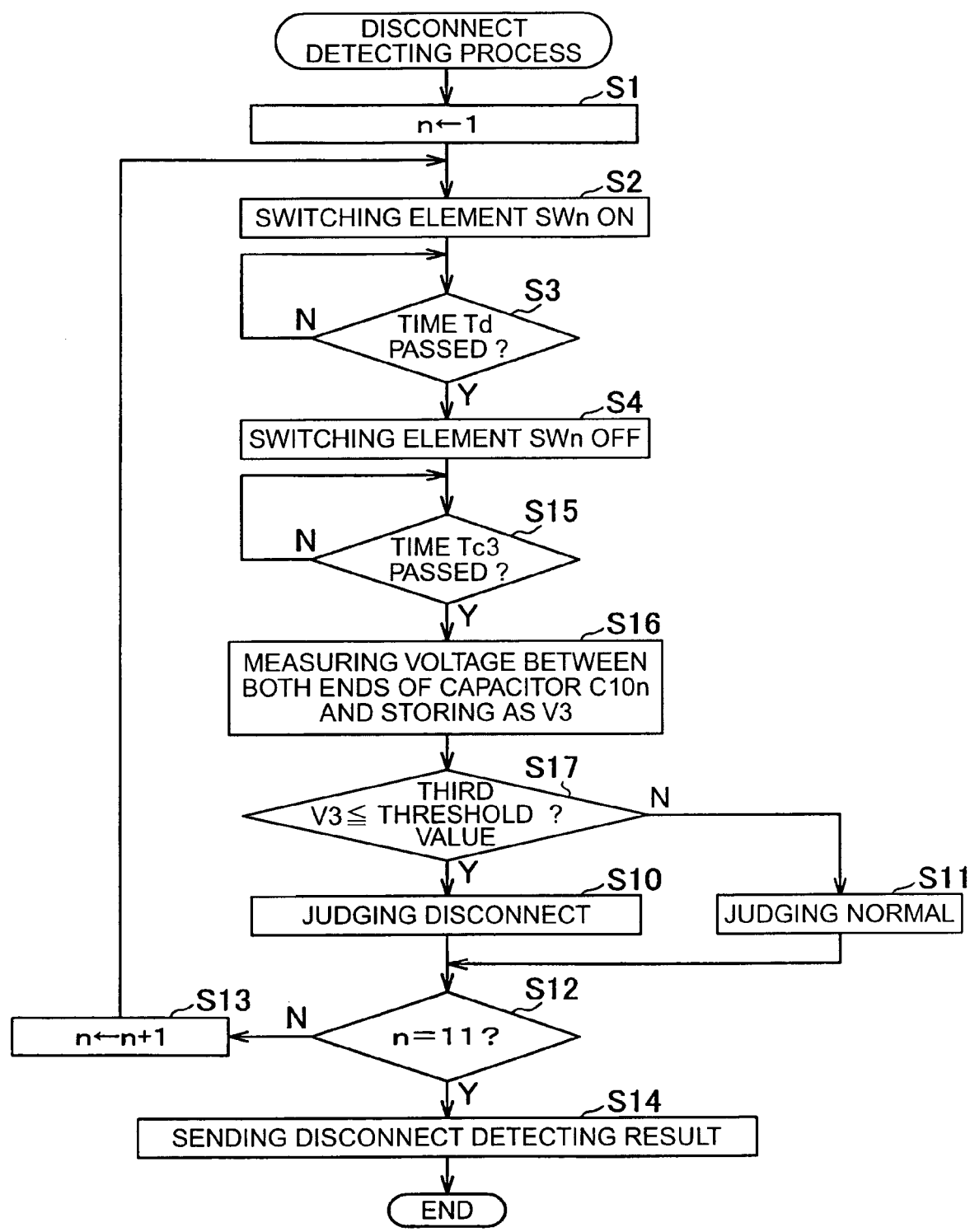
FIG. 10 is a flowchart showing a disconnection detecting procedure of the control circuit shown in FIG. 2 according to the second embodiment.

Next, the disconnection detecting principle of the voltage measuring device according to the second embodiment will be explained with reference to FIG. 10. Incidentally, the steps similar to the first embodiment are assigned to the same reference marks, and the detailed explanations of those are omitted. Firstly, the control circuit 18 goes to steps S1 to S4 similar to the first embodiment. Then, the control circuit 18 turns off the switching element SWn, and as shown in FIG. 10, waits until the third predetermined time Tc3 is passed ("Y" in step S15). Then, the control circuit 18 works as the third capacitor voltage measuring device to measure the voltage between both ends of the capacitor C10n, and save the voltage as V3 in the RAM (step S16).

Then, when V3 is equal to or less than the third threshold value ("Y" in step S17), the control circuit 18 judges that the electric path between the unit cell BTn and the voltage measuring IC 11 is disconnected, and stores the disconnection detecting result in the RAM (step S10). On the other hand, when V3 is more than the third threshold value ("N" in step S17), the control circuit 18 judges that the electric path between the unit cell BTn and the voltage measuring IC 11 is normal (step S11), and stores the disconnection detecting result in the RAM (step S12). Because next following steps are similar to the first embodiment, the detailed explanation is omitted.

In the second embodiment described above, the control circuit 18 detects the disconnection of the electric path based on whether the voltage between both ends of the capacitor C10n after the third predetermined time Tc3 is passed from the time when the switching element SWn is turned off is equal to or less than the third threshold value or not. Therefore, similar to the first embodiment, by using the resistors R100 to R111 for equalizing by discharging the unit cells BT$_1$ to BT$_{55}$, the switching elements SW1 to SW11, and the noise filter capacitor C101 to C111, the disconnection can be detected. Therefore, a low-cost disconnection detecting device can be realized by preventing an increase of the electric components.

Further, according to the second embodiment, because the third threshold value is less than the minimum voltage between both ends of the unit cell BTn under the normal condition, even if the voltage between both ends of the unit cell BTn is varied, the disconnection is correctly detected.

Further, according to the second embodiment, because the third predetermined time Tc3 is longer than 3*time constant τ2, and shorter than time constant τ1, the voltage between both ends of the capacitor C10n after the third predetermined time Tc3 is passed is surely less than the minimum voltage between both ends of the unit cell BTn under the disconnection condition. Therefore, the disconnection of the electric path is correctly detected.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A disconnection detecting device for detecting a disconnection of electric paths connecting each both ends of a plurality of series-connected unit cells with a voltage measuring device for measuring a voltage between both ends of the unit cells, said disconnection detecting device comprising:
    a plurality of resistors respectively provided at the electric paths connecting both ends of each of the unit cells with the voltage measuring device;
    a plurality of switching elements connected in parallel to the respective unit cells via the resistors;
    a plurality of capacitors connected in parallel to the respective unit cells and the respective switch elements via the resistors;
    a switch control devise for firstly turning on the switch element to discharge the capacitor to make a voltage between both ends of the capacitor zero, and then turning off the switching element;
    a first capacitor voltage measuring device for measuring a voltage between both ends of the capacitor, firstly after the switch control device turns off the switch element, then, at the time after the voltage between both ends of the capacitor becomes equal to the voltage between both ends of the unit cell when the electric path is normal, and before the voltage between both ends of the capacitor becomes equal to the voltage between both ends of the unit cell when the electric path is disconnected;
    a second capacitor voltage measuring device for measuring a voltage between both ends of the capacitor after the first capacitor voltage measuring device measures the voltage; and
    a disconnection detecting unit for detecting the disconnection of the electric path based on the respective measured voltages between both ends of the capacitor by the first and second capacitor voltage measuring devices.

2. The disconnection detecting device as claimed in claim 1,
    wherein the disconnection detecting device detects the disconnection when (the voltage between both ends of the capacitor measured by the first capacitor voltage measuring device)/(the voltage between both ends of the capacitor measured by the second capacitor voltage measuring device) is equal to or less than a first threshold value, or when (the voltage between both ends of the capacitor measured by the second capacitor voltage measuring device)/(the voltage between both ends of the capacitor measured by the first capacitor voltage measuring device) is equal to or more than a second threshold value.

3. The disconnection detecting device as claimed in claim 2,
    wherein the first capacitor voltage measuring device is so set to measure the voltage between both ends of the capacitor after first predetermined time is passed from the time that the switch control device turns off the switching element, and the second capacitor voltage measuring device is so set to measure the voltage between both ends of the capacitor after second predetermined time which is longer than the first predetermined time is passed from the time that the switch control device turns off the switching element,
    wherein the first predetermined time is set to be longer than 3* (charge time constant of the capacitor when the electric path is normal) and shorter than 0.4* (charge time constant of the capacitor when the electric path is disconnected), and
    wherein the second predetermined time is set to be longer than (charge time constant of the capacitor when the electric path is disconnected), and wherein the first threshold value is equal to or less than 0.5 or the second threshold value is equal to or more than 2.

4. A disconnection detecting device for detecting a disconnection of electric paths connecting each both ends of a plurality of series-connected unit cells with a voltage measuring device for measuring a voltage between both ends of the unit cells, said disconnection detecting device comprising:
- a plurality of resistors respectively provided at the electric paths connecting both ends of each of the unit cells with the voltage measuring device;
- a plurality of switching elements connected in parallel to the respective unit cells via the resistors;
- a plurality of capacitors connected in parallel to the respective unit cells and the respective switch elements via the resistors;
- a switch control devise for firstly turning on the switch element to discharge the capacitor to make a voltage between both ends of the capacitor zero, and then turning off the switching element;
- a third capacitor voltage measuring device for measuring a voltage between both ends of the capacitor, firstly after the switch control device turns off the switch element, then, at the time after the voltage between both ends of the capacitor becomes equal to the voltage between both ends of the unit cell when the electric path is normal, and before the voltage between both ends of the capacitor becomes equal to the voltage between both ends of the unit cell when the electric path is disconnected;
- a disconnection detecting unit for detecting the disconnection of the electric path when the voltage between both ends of the capacitor measured by the third capacitor voltage measuring device is less than a third threshold value.

5. The disconnection detecting device as claimed in claim 4,
wherein the third threshold value is set to be less than a minimum voltage between both ends of the unit cell when the unit cell is normal.

6. The disconnection detecting device as claimed in claim 5,
wherein the third capacitor voltage measuring device is so set to measure the voltage between both ends of the capacitor after a third predetermined time is passed from the time that the switch control device turns off the switching element,
wherein the third predetermined time is set to be longer than 3* (charge time constant of the capacitor when the electric path is normal) and shorter than 1* (charge time constant of the capacitor when the electric path is disconnected), and
wherein the second predetermined time is set to be longer than 1* (charge time constant of the capacitor when the electric path is disconnected).

7. A disconnection detecting device for detecting a disconnection of electric paths connecting each both ends of a plurality of series-connected unit cells with a voltage measuring device for measuring a voltage between both ends of the unit cells, said disconnection detecting device comprising:
- a plurality of resistors respectively provided at the electric paths connecting both ends of each of the unit cells with the voltage measuring device;
- a plurality of switching elements connected in parallel to the respective unit cells via the resistors;
- a plurality of capacitors connected in parallel to the respective unit cells and the respective switch elements via the resistors;
- a first capacitor voltage measuring device for measuring a voltage between both ends of the capacitor before the switching element is turned on;
- a switch control devise for firstly turning on the switch element to discharge the capacitor to make a voltage between both ends of the capacitor zero, and then turning off the switching element;
- a second capacitor voltage measuring device for measuring the voltage between both ends of the capacitor after the switching element is turned on; and
- a disconnection detecting unit for detecting the disconnection of the electric path based on the respective measured voltages between both ends of the capacitor by the first and second capacitor voltage measuring devices.

8. The disconnection detecting device as claimed in claim 7,
wherein the second capacitor voltage measuring device is so set to measure the voltage between both ends of the capacitor after a predetermined time is passed from the time that the switch control device turns off the switching element,
wherein the disconnection detecting unit is so set to detect the disconnection of the electric path based on a comparison between the voltage between both ends of the capacitor measured by the second capacitor voltage measuring device, and a threshold value determined corresponding to the voltage between both ends of the capacitor measured by the first capacitor voltage measuring device, and
wherein the predetermined time is set between the time when the voltage between both ends of the capacitor becomes constant from zero in a case that the electric path is normal, and the switching element is turned off to charge the capacitor, and the time when the voltage between both ends of the capacitor becomes constant from zero in a case that the electric path is disconnected, and the switching element is turned off to charge the capacitor.

9. The disconnection detecting device as claimed in claim 8,
wherein the predetermined time is set between the time when the voltage between both ends of the capacitor becomes constant from zero in a case that the electric path is normal, and the switching element is turned off to charge the capacitor, and a charge time constant of the capacitor in a case that the electric path is disconnected.

10. The disconnection detecting device as claimed in claim 9,
wherein the threshold value is set to be equal to or less than 0.63* (the voltage between both ends of the capacitor measured by the first capacitor voltage measuring device).

11. The disconnection detecting device as claimed in claim 8,
wherein the predetermined time is set as the time when the voltage between both ends of the capacitor becomes constant from zero in a case that the electric path is normal, and the switching element is turned off to charge the capacitor, which is defined by 3* (charge time constant of the capacitor determined by the resistor and the capacitor in a case that the electric path is normal).

12. The disconnection detecting device as claimed in claim 9,
wherein the predetermined time is set as the time when the voltage between both ends of the capacitor becomes constant from zero in a case that the electric path is normal, and the switching element is turned off to charge the capacitor, which is defined by 3* (charge time constant of the capacitor determined by the resistor and the capacitor in a case that the electric path is normal).

13. The disconnection detecting device as claimed in claim 10,
wherein the predetermined time is set as the time when the voltage between both ends of the capacitor becomes constant from zero in a case that the electric path is normal, and the switching element is turned off to charge the capacitor, which is defined by 3* (charge time constant of the capacitor determined by the resistor and the capacitor in a case that the electric path is normal).

* * * * *